United States Patent
Miyazaki et al.

(10) Patent No.: US 11,228,320 B2
(45) Date of Patent: Jan. 18, 2022

(54) INFORMATION PROCESSING DEVICE, INFORMATION PROCESSING METHOD, AND COMPUTER READABLE MEDIUM

(71) Applicant: Mitsubishi Electric Corporation, Tokyo (JP)

(72) Inventors: Kiyohito Miyazaki, Tokyo (JP); Naoki Ito, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/010,341

(22) Filed: Sep. 2, 2020

(65) Prior Publication Data
US 2020/0403730 A1    Dec. 24, 2020

Related U.S. Application Data

(63) Continuation of application No. PCT/JP2018/016884, filed on Apr. 25, 2018.

(51) Int. Cl.
*H03M 13/09* (2006.01)
*H03M 13/00* (2006.01)
*H04L 1/00* (2006.01)

(52) U.S. Cl.
CPC ....... *H03M 13/09* (2013.01); *H03M 13/6516* (2013.01); *H04L 1/0041* (2013.01); *H04L 1/0061* (2013.01)

(58) Field of Classification Search
CPC .... H04L 1/0041; H04L 1/0061; H03M 13/09; H03M 13/35; H03M 13/6513
See application file for complete search history.

(56) References Cited

U.S. PATENT DOCUMENTS

| | | |
|---|---|---|
| 7,770,008 B2 | 8/2010 | Walmsley |
| 8,787,506 B2 | 7/2014 | Sikri |

(Continued)

FOREIGN PATENT DOCUMENTS

| | | |
|---|---|---|
| JP | 9-275391 A | 10/1997 |
| JP | 2003-87321 A | 3/2003 |

(Continued)

OTHER PUBLICATIONS

International Search Report issued in PCT/JP2018/016884 (PCT/ISA/210), dated Jul. 17, 2018.

(Continued)

*Primary Examiner* — Shelly A Chase
(74) *Attorney, Agent, or Firm* — Birch, Stewart, Kolasch & Birch, LLP

(57) ABSTRACT

A checksum negotiation unit selects as a candidate polynomial, a candidate for a generator polynomial to be used in communication between a safety master device and a safety slave device from a plurality of polynomials. A communication cycle verification unit determines whether or not a calculation using the candidate polynomial is completed in each of the safety master device and the safety slave device by a predetermined deadline. The communication cycle verification unit designates the candidate polynomial as the generator polynomial when it is determined that the calculation using the candidate polynomial is completed in each of the safety master device and the safety slave device by the deadline.

12 Claims, 14 Drawing Sheets

(56) References Cited

U.S. PATENT DOCUMENTS

2010/0031124 A1    2/2010  Shinagawa et al.
2012/0266053 A1*  10/2012  Kang .................... H03M 13/09
                                                      714/807
2014/0044032 A1*   2/2014  Lei ..................... H04W 52/0219
                                                      370/311

FOREIGN PATENT DOCUMENTS

JP    2004-104250 A    4/2004
JP    2009-171539 A    7/2009
JP    2009-171540 A    7/2009
JP    2013-225761 A   10/2013

OTHER PUBLICATIONS

Office Action dated Sep. 2021 in corresponding Indian Patent Application No. 202047037788.

* cited by examiner

Fig. 9

| NUMBER | DEGREE | POLYNOMIAL | MINIMUM HAMMING DISTANCE | DISTRIBUTION COEFFICIENT $A_i$ |
|---|---|---|---|---|
| 1 | CRC-8 | ⋮ | ⋮ | ⋮ |
| 2 | CRC-16 | ⋮ | ⋮ | ⋮ |
| 3 | CRC-24 | ⋮ | ⋮ | ⋮ |
| 4 | CRC-32 | ⋮ | ⋮ | ⋮ |

Fig. 11

| CRC POLYNOMIAL | REALIZABLE COMMUNICATION CYCLE |
|---|---|
| CRC-8 | 3.0 ms |
| CRC-16 | 3.5 ms |
| CRC-24 | 4.5 ms |
| CRC-32 | X (NOT SUPPORTED) |

Fig.12

| NUMBER | DEGREE | POLYNOMIAL | MINIMUM HAMMING DISTANCE | DISTRIBUTION COEFFICIENT $A_i$ |
|---|---|---|---|---|
| 1 | CRC-8 | ⋮ | ⋮ | ⋮ |
| 2 | CRC-8 (A) + CRC-8 (B) | ⋮ | ⋮ | ⋮ |
| 3 | CRC-16 | ⋮ | ⋮ | ⋮ |
| 4 | CRC-16 (A) + CRC-16 (B) | ⋮ | ⋮ | ⋮ |
| 5 | CRC-24 | ⋮ | ⋮ | ⋮ |
| 6 | CRC-32 | | | |

INFORMATION PROCESSING DEVICE, INFORMATION PROCESSING METHOD, AND COMPUTER READABLE MEDIUM

CROSS REFERENCE TO RELATED APPLICATIONS

This application is a Continuation of PCT International Application No. PCT/JP2018/016884, filed on Apr. 25, 2018, which is hereby expressly incorporated by reference into the present application.

TECHNICAL FIELD

The present invention relates to designation of a generator polynomial.

BACKGROUND ART

In safety communication based on IEC (International Electrotechnical Commission) 61784-3, integrity of a safety PDU (Protocol Data Unit) against a bit error occurring in a transmission path needs to be less than a required value based on a safety degree level. As a typical safety measure for ensuring the integrity, a checksum such as CRC (Cyclic Redundancy Check) or the like is widely used.

Since a CRC calculation generally needs a large processing amount in general communication, the CRC calculation is performed by hardware. However, in the safety communication, it is performed by software in many cases. In a case where the CRC calculation is performed by hardware, since a diagnose of hardware based on IEC61508 is necessary, a process load increases. In order to avoid this increase in the process load, in the safety communication, the CRC calculation is often performed by software.

The CRC has a plurality of variations with different degrees such as CRC-16 and CRC-32. Generally, a CRC polynomial with a larger degree has a higher error detection ability and can achieve a low residual error rate, but on the other hand, a calculation amount (time or space) becomes large.

Such a problem of the calculation amount is unlikely to be a problem in a device having abundant calculation resources, but it is a problem in an embedded device which has limited calculation resources, in which a process needs to be completed within a predetermined time.

In a technique of Patent Literature 1, for a given data length and a given data type, a CRC generator polynomial which enables a non-detection error rate to be minimized is selected.

Therefore, in the technique of Patent Literature 1, there are a step of obtaining maximum and minimum Hamming distances of the generator polynomial for all code lengths and a step of selecting the generator polynomial which enables the minimum Hamming distance to be maximized, according to a data length and a data type of data to be transmitted and received.

CITATION LIST

Patent Literature

Patent Literature 1: JP No. 2009-171539 A

SUMMARY OF INVENTION

Technical Problem

In the technique of Patent Literature 1, only minimization of the non-detection error rate is considered. Therefore, there is a problem that under a condition where the calculation resources are limited, a necessary process cannot be completed within a safety response time required for the safety communication. Besides, the safety response time is, for example, a time from an occurrence of detection by a safety sensor or the like until a control target actuator or the like is shifted to a safety state. A required value for the safety response time is decided based on a system configuration. Further, one of components of the safety response time is a safety communication cycle.

Generally, in order to lower the non-detection error rate of the CRC polynomial, a polynomial with a large degree is necessary. If the polynomial with the large degree is used, the calculation amount necessary for the CRC calculation becomes large, and it becomes difficult to satisfy a constraint of the safety communication cycle. Therefore, it is considered that the safety communication cycle which is set small with a margin is set large within a range of the margin. However, this method increases a probability that the safety PDU is not transmitted and received within the predetermined time due to a communication error. Therefore, a problem occurs that a system shifts to the safety state more than necessary and availability of the system is deteriorated.

In consideration of such circumstances, the present invention mainly aims to obtain a configuration capable of designating a polynomial which enables a calculation to be completed by a predetermined deadline even under a condition where calculation resources are limited.

Solution to Problem

An information processing device according to the present invention comprises:

a selection unit to select as a candidate polynomial, a candidate for a generator polynomial to be used in communication between a master device and a slave device from a plurality of polynomials;

a determination unit to determine whether or not a calculation using the candidate polynomial is completed in each of the master device and the slave device by a predetermined deadline; and a designation unit to designate the candidate polynomial as the generator polynomial when it is determined by the determination unit that the calculation using the candidate polynomial is completed in each of the master device and the slave device by the deadline.

Advantageous Effects of Invention

According to the present invention, it is capable of designating a polynomial which enables a calculation to be completed by a predetermined deadline even under a condition where calculation resources are limited.

BRIEF DESCRIPTION OF DRAWINGS

FIG. 9 is a diagram illustrating an example of a CRC polynomial table according to the first embodiment;

FIG. 11 is a diagram illustrating an example of calculation ability information according to the second embodiment;

FIG. 12 is a diagram illustrating an example of a CRC polynomial table according to a third embodiment;

DESCRIPTION OF EMBODIMENTS

Figure 1:
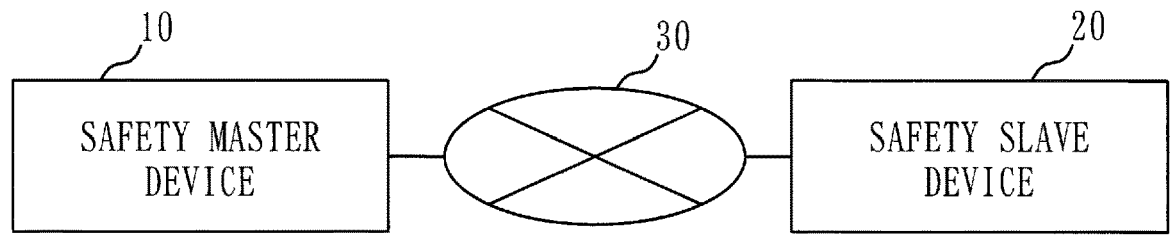
FIG. 1 is a diagram illustrating a configuration example of a safety communication system according to a first embodiment.

Hereinafter, embodiments of the present invention will be described with reference to the drawings. In the following description of the embodiments and the drawings, the same reference numerals are assigned to the same or corresponding parts.

First Embodiment

*Outline*

In the present embodiment, a configuration will be described which can realize reduction of a processing amount of a CRC calculation necessary for a safety communication, using an inexpensive embedded device. Specifically, in the present embodiment, a configuration will be described which can realize a selection of an optimum CRC polynomial which can achieve both a residual error rate required for a standard and a safety communication cycle required for a system, using a microcomputer with limited calculation resources.

Regarding the residual error rate required for a safety standard, in IEC 61784-3 which is an international standard, the residual error rate decided by the followings is required to be less than a required value decided for each aimed safety degree level (a relationship between each value and the residual error rate is indicated inside parentheses).

A size n of a safety PDU (the smaller the size n is, the lower the residual error rate is)

A transmission rate v of the safety PDU per hour (the smaller the transmission rate v is, the lower the residual error rate is)

A minimum Hamming distance hd of a checksum generator polynomial used for bit error detection (the larger the minimum Hamming distance hd is, the lower the residual error rate is)

A bit error rate $P_e$ in an assumed transmission path, (the smaller the bit error rate $P_e$ is, the lower the residual error rate is)

The safety communication cycle is set based on an acceptable response time. The acceptable response time is decided based on a safety response time required for the system. Then, a user sets the safety communication cycle based on the acceptable response time. In the safety communication, if a normal safety PDU without damage is not received within a predetermined time (hereinafter, referred to as $t_r$), a transition to a safety state such that a device is stopped is carried out. To avoid frequent transitions to the safety state due to a bit error and the like, in many cases, a safety communication cycle $T_{safety}$ is provided with a margin so that a plurality of safety PDUs are received within $t_r$, and a value several times smaller than $t_r$ is set as the safety communication cycle $T_{safety}$.

In the present embodiment, the safety communication cycle is extended according to performance of the transmission path as long as availability of the system is not impaired. Examples of an equation that serves as a criterion for whether or not to extend the safety communication cycle are indicated below.

Following equations represent that one or more safety PDUs are transmitted within the predetermined time $t_r$ (equation 1), and that an occurrence rate of a safety stop due to an abnormality of the safety PDU is not below a required value (equation 2).

In the present embodiment, the safety communication cycle is relaxed (extended) as long as both of following two equations are satisfied.

[Formula 1]

$$T_{safety} < t_r \quad \text{(equation 1)}$$

$$P_{fault}^{\left\lceil \frac{T_{safety}}{t_r} \right\rceil} \times v < R_{fault} \quad \text{(equation 2)}$$

$T_{safety}$: the safety communication cycle $t_r$: a required value for a receiving interval of the normal safety PDU $P_{fault}$: a probability of occurrence of the abnormality of the safety PDU v: a safety PDU transmission rate $R_{fault}$: a required value of a safety stop occurrence rate due to the abnormality of the safety PDU

*Description of Configuration*

FIG. 1 illustrates a configuration example of a safety communication system according to the present embodiment.

The safety communication system according to the present embodiment includes one or a plurality of safety master devices 10, one or a plurality of safety slave devices 20, and a network 30 connecting the safety master devices 10 and the safety slave devices 20.

The safety master device 10 and the safety slave device 20 generate a one-to-one safety connection (a logical connection used for the safety communication) and perform the safety communication. The safety master device 10 and the safety slave device 20 are each, for example, embedded devices.

The safety master device 10 manages the safety slave device 20.

The safety slave device 20 is connected to, for example, a safety sensor. Further, the safety slave device 20 controls, for example, an actuator.

The safety slave device 20 notifies the safety master device 10 of a sensor value of the safety sensor in the safety communication. Further, for example, the safety master device 10 notifies the safety slave device 20 of a control value of the actuator in the safety communication, based on the sensor value of the safety sensor. Then, the safety slave device 20 controls the actuator using the control value notified from the safety master device 10. Above process procedure needs to be completed within the safety response time.

In FIG. 1, although a pair of the safety master device 10 and the safety slave device 20 are illustrated, as described above, each of the number of safety master devices 10 and the number of safety slave devices 20 included in the safety communication system is not limited to an example in FIG. 1.

The safety master device 10 corresponds to a master device. The safety slave device 20 corresponds to a slave device.

Figure 2:
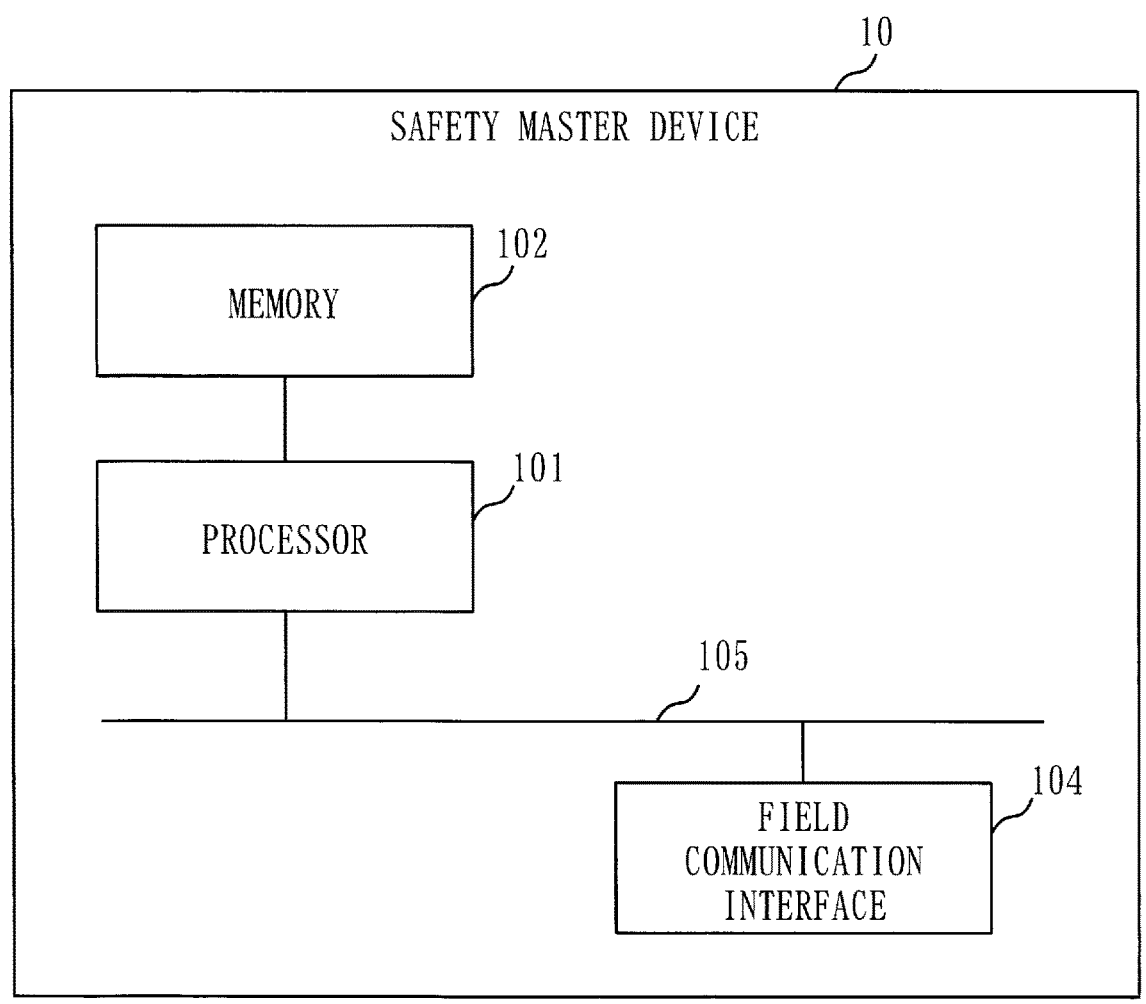
FIG. 2 is a diagram illustrating a hardware configuration example of a safety master device according to the first embodiment.

FIG. 2 illustrates a hardware configuration example of the safety master device 10.

The safety master device 10 includes a processor 101, a memory 102, a field communication interface 104, and a bus 105 connecting these.

The safety master device 10 is a computer.

The processor 101 executes a safety communication layer which is a communication processing program expanded on the memory 102 to perform the safety communication with an opposing safety slave device 20 via the bus 105 and the field communication interface 104.

Figure 3:
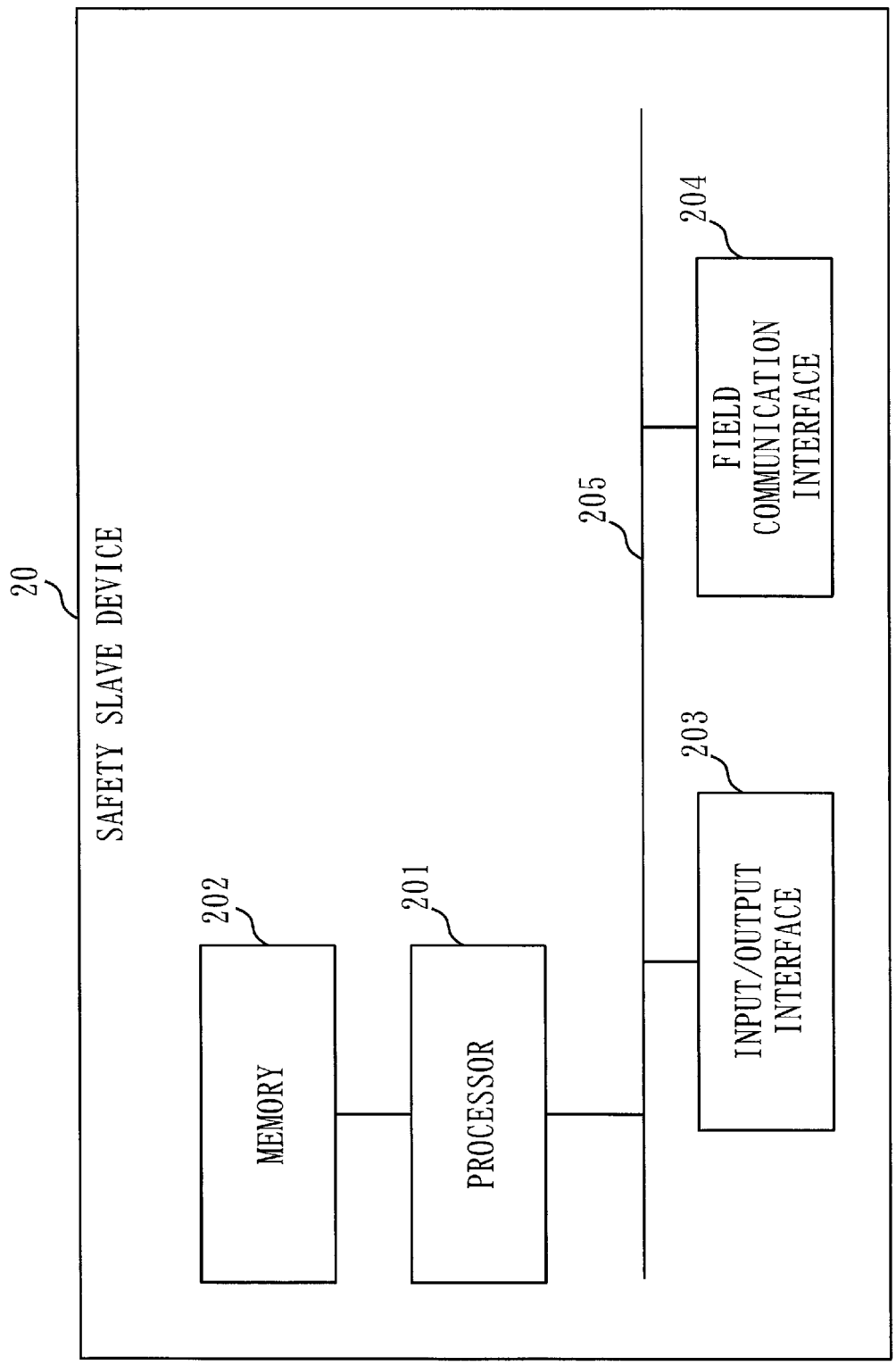
FIG. 3 is a diagram illustrating a hardware configuration example of a safety slave device according to the first embodiment.

FIG. 3 illustrates a hardware configuration example of the safety slave device 20.

The safety slave device 20 includes a processor 201, a memory 202, an input/output interface 203, a field communication interface 204, and a bus 205 connecting these.

The safety slave device 20 is a computer.

The processor 201 executes a safety communication layer which is a communication processing program expanded on the memory 202 to perform the safety communication with an opposing safety master device 10 via the bus 205 and the field communication interface 204.

As illustrated in FIG. 3, the safety slave device 20 includes the input/output interface 203 for performing device control. For example, the safety slave device 20 controls the actuator via the input/output interface 203.

Figure 4:
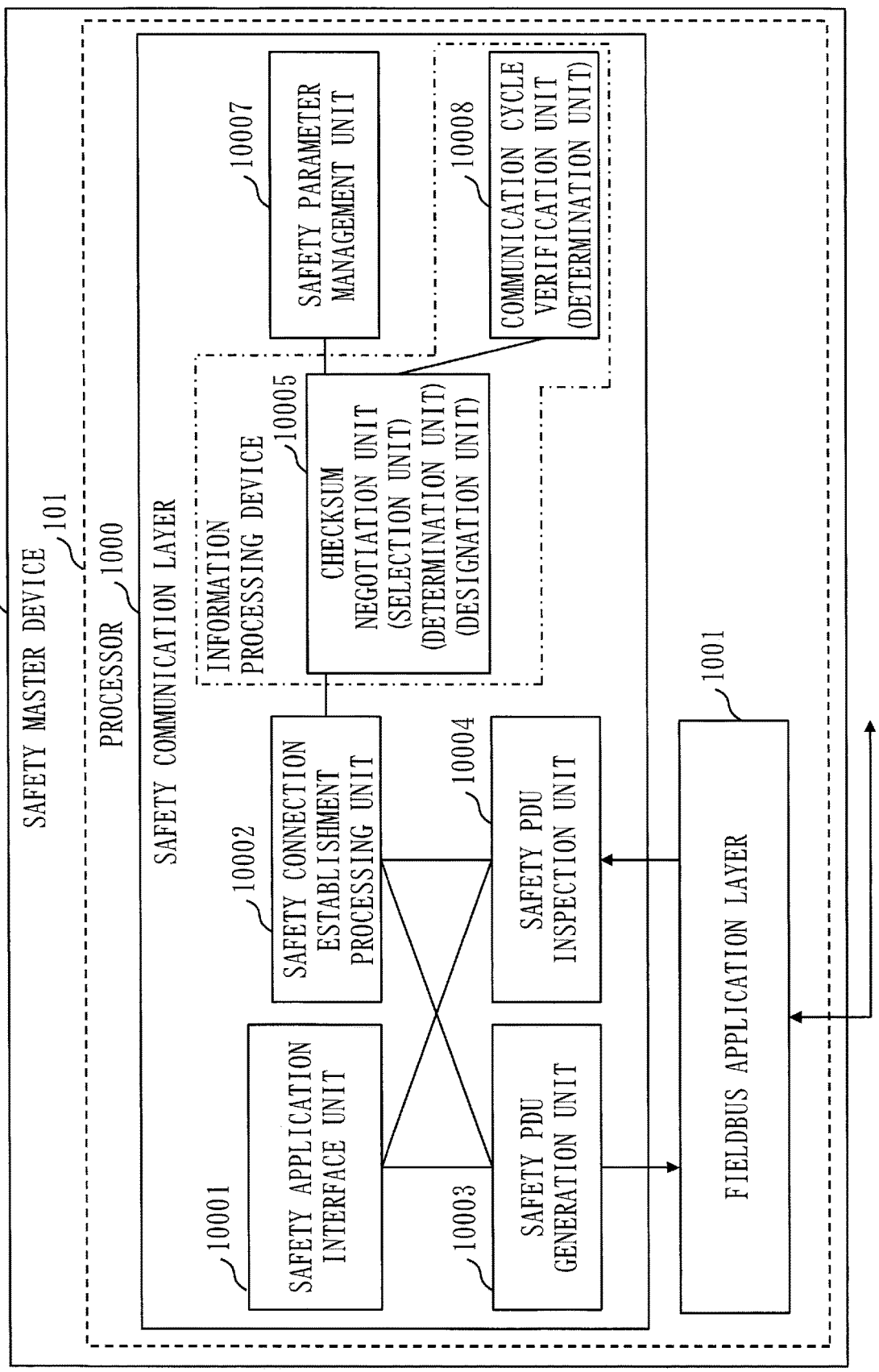
FIG. 4 is a diagram illustrating a functional configuration example of the safety master device according to the first embodiment.

FIG. 4 illustrates a functional configuration example of the safety master device 10.

The safety master device 10 includes a safety communication layer 1000 and a fieldbus application layer 1001.

The safety communication layer 1000 and the fieldbus application layer 1001 are implemented by a program.

The safety communication layer 1000 communicates with a safety communication layer 2000 described later of the opposing safety slave device 20 via the fieldbus application layer 1001.

The safety communication layer 1000 includes a safety application interface unit 10001, a safety connection establishment processing unit 10002, a safety PDU generation unit 10003, a safety PDU inspection unit 10004, a checksum negotiation unit 10005, a safety parameter management unit 10007, and a communication cycle verification unit 10008.

Elements other than the checksum negotiation unit 10005 and the communication cycle verification unit 10008 are the same as elements used in a general safety communication.

More specifically, the safety PDU generation unit 10003 generates the safety PDU in response to a requirement from the safety application interface unit 10001 or the safety connection establishment processing unit 10002.

The safety PDU inspection unit 10004 receives via the fieldbus application layer 1001, the safety PDU addressed to the safety application interface unit 10001 or the safety connection establishment processing unit 10002 and inspects the received safety PDU.

The safety application interface unit 10001 receives and delivers a transmitted and received safety PDU to a user application.

The safety connection establishment processing unit 10002 performs a process for establishing the safety connection with the safety communication layer 2000 described later of the safety slave device 20 in a predetermined communication sequence from a state where the safety connection is disconnected.

The safety parameter management unit 10007 stores a safety parameter of the safety master device 10 and the safety slave device 20, which is used for the safety communication. As the safety parameter of the safety master device 10, at least followings are necessary.

(1) A required value of the safety degree level as a system
(2) Following values for each of the safety slave devices 20:
   (A) The safety communication cycle (can be calculated back from the safety PDU transmission rate)
   (B) A safety data size
   (C) Identification information of a polynomial to be used
   (D) The bit error rate of transmission path (only in a case where there is a proven value)

In the process of establishing the safety connection, between the checksum negotiation unit 10005 and the safety communication layer 2000 of the opposing safety slave device 20, the checksum negotiation unit 10005 adjusts and decides a CRC polynomial, a transmitting interval, structure of the safety PDU, and the like used for the safety communication.

Further, the checksum negotiation unit 10005 selects from a plurality of CRC polynomials, a candidate for the generator polynomial to be used in communication between the safety master device 10 and the safety slave device 20. More specifically, the checksum negotiation unit 10005 selects the CRC polynomial with a maximum degree from the plurality of CRC polynomials. Hereinafter, the CRC polynomial selected by the checksum negotiation unit 10005 will be referred to as a tentatively-selected polynomial. The tentatively-selected polynomial corresponds to a candidate polynomial.

Further, when it is determined that a calculation using the tentatively-selected polynomial is completed within the safety communication cycle in each of the safety master device 10 and the safety slave device 20, the checksum negotiation unit 10005 designates the tentatively-selected polynomial as the generator polynomial used in the communication between the safety master device 10 and the safety slave device 20.

The checksum negotiation unit 10005 corresponds to a selection unit, a determination unit, and a designation unit. Also, a process performed by the checksum negotiation unit 10005 corresponds to a selection process, a determination process, and a designation process.

Details of operation of the checksum negotiation unit 10005 will be described later.

The communication cycle verification unit 10008 verifies according to an instruction from the checksum negotiation unit 10005, whether or not a generation process and an inspection process of the safety PDU using the tentatively-selected polynomial selected by the checksum negotiation unit 10005 are completed within the safety communication cycle predetermined by the safety parameters. That is, the communication cycle verification unit 10008 determines whether or not the calculation using the tentatively-selected polynomial is completed in the safety master device 10 by a predetermined deadline (an end time of the safety communication cycle). The generation process of the safety PDU mentioned above is a process for generating the safety PDU to be transmitted to the safety slave device 20, the process including generation of the CRC. The inspection process of the safety PDU mentioned above is a process for performing an inspection using the CRC on the safety PDU received from the safety slave device 20.

The communication cycle verification unit 10008 can measure process time by emulating actual process operation and perform verification of whether or not the generation process and the inspection process of the safety PDU using the tentatively-selected polynomial are completed within the safety communication cycle. Further, the communication cycle verification unit 10008 can perform by using a calculation equation quantified preliminarily, the verification of whether or not the generation process and the inspection process of the safety PDU using the tentatively-selected polynomial are completed within the safety communication cycle.

Although various methods are considered as a verification method, in the present embodiment, the communication cycle verification unit 10008 is to perform the verification by applying an existing technique, and details of the verification method will not be described.

Further, the communication cycle verification unit 10008, together with the checksum negotiation unit 10005 and a communication cycle verification unit 20008 described later of the safety slave device 20, corresponds to a determination unit. Further, a process performed by the communication cycle verification unit 10008, together with the process performed by the checksum negotiation unit 10005 and a process performed by the communication cycle verification unit 20008 described later of the safety slave device 20, corresponds to a determination process.

FIG. 4 schematically illustrates a state in which the processor 101 is executing a program that implements functions of the safety communication layer 1000 and the fieldbus application layer 1001.

Further, in the present embodiment, the checksum negotiation unit 10005, the communication cycle verification unit 10008, and the communication cycle verification unit 20008 of the safety slave device 20 configure an information processing device of the present application.

Figure 5:
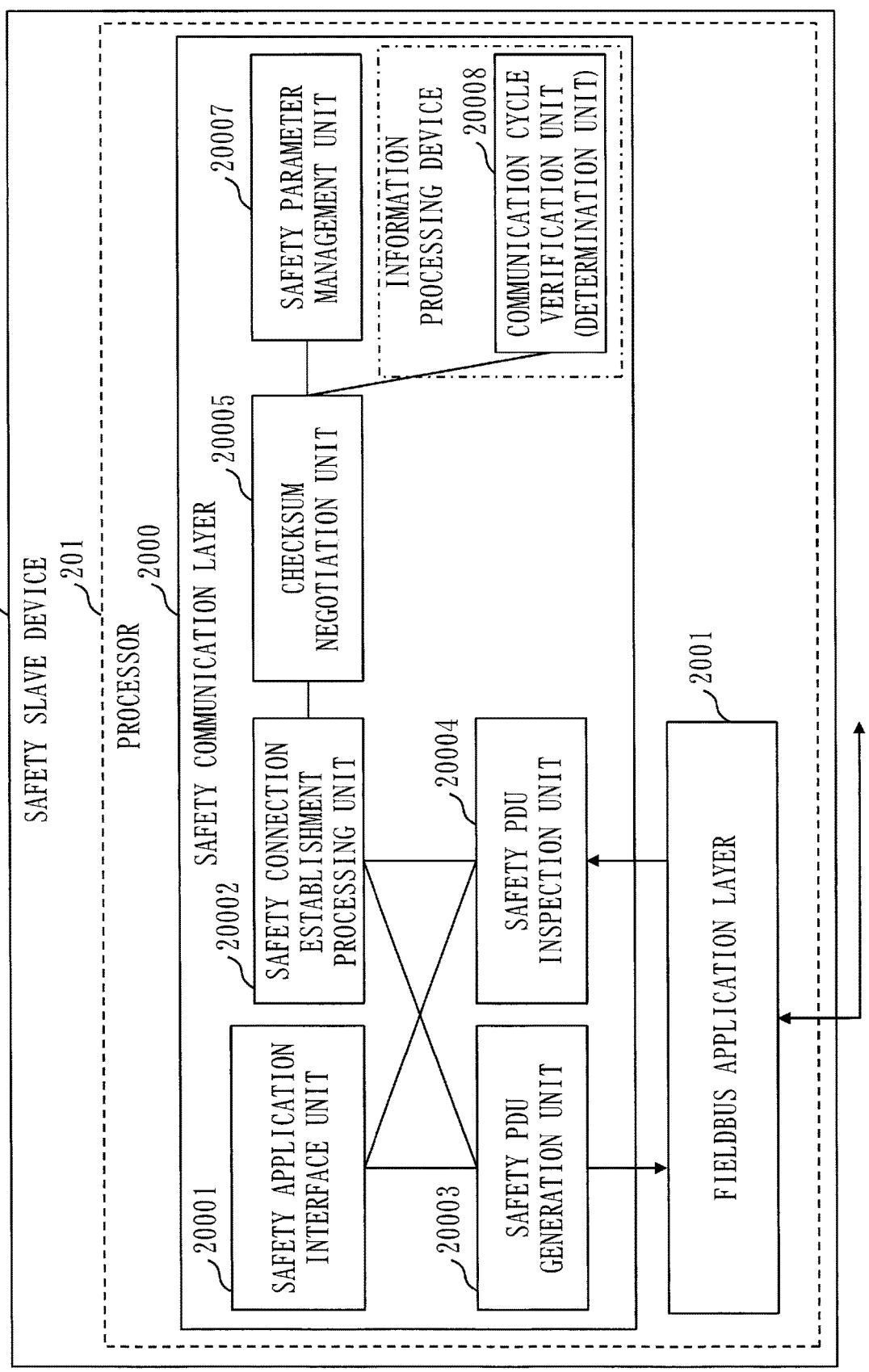
FIG. 5 is a diagram illustrating a functional configuration example of the safety slave device according to the first embodiment.

FIG. 5 illustrates a functional configuration example of the safety slave device 20.

The safety slave device 20 includes the safety communication layer 2000 and a fieldbus application layer 2001.

The safety communication layer 2000 and the fieldbus application layer 2001 are implemented by a program.

The safety communication layer 2000 communicates with the safety communication layer 1000 of the opposing safety master device 10 via the fieldbus application layer 2001.

The safety communication layer 2000 includes a safety application interface unit 20001, a safety connection establishment processing unit 20002, a safety PDU generation unit 20003, a safety PDU inspection unit 20004, a checksum negotiation unit 20005, a safety parameter management unit 20007, and the communication cycle verification unit 20008.

A configuration of the safety communication layer 2000 is the same as that of the safety communication layer 1000.

Since the safety connection establishment processing unit 20002 and the checksum negotiation unit 20005 communicate opposing to the safety master device 10, a process flow differs from that of the safety connection establishment processing unit 10002 and the checksum negotiation unit 10005.

Between the safety communication layer 2000 and the safety communication layer 1000, differences other than these are described below.

The safety parameter management unit 20007 holds safety parameters necessary for the safety slave device 20.

The safety parameters held by the safety parameter management unit 20007 are as follows.

(1) Following values for the safety master device 10:
  (A) The safety communication cycle (can be calculated back from the safety PDU transmission rate)
  (B) A safety data size
  (C) Identification information of the polynomial to be used The communication cycle verification unit 20008 verifies according to an instruction from the checksum negotiation unit 20005, whether or not a generation process and an inspection process of the safety PDU using the tentatively-selected polynomial selected by the checksum negotiation unit 10005 are completed within the safety communication cycle predetermined by the safety parameters. That is, the communication cycle verification unit 20008 determines whether or not the calculation using the tentatively-selected polynomial selected is completed in the safety slave device 20 by the predetermined deadline (an end time of the safety communication cycle). Besides, the generation process of the safety PDU mentioned above is a process for generating the safety PDU to be transmitted to the safety master device 10, the process including generation of the CRC. The inspection process of the safety PDU mentioned above is a process for performing inspection using the CRC on the safety PDU received from the safety master device 10.

Generally, the number of safety connections to be generated by the safety slave device 20 is small, so that a load on the safety slave device 20 caused by the safety communication is small. However, since the safety slave device 20 also has limited computational resources, the verification mentioned above is necessary.

In addition, there is a possibility that the safety slave device 20 is not supported for the tentatively-selected polynomial selected by the checksum negotiation unit 10005. Therefore, before performing the verification on the safety communication cycle, the communication cycle verification unit 20008 verifies whether or not the safety slave device 20 is supported for the tentatively-selected polynomial.

For a method for verifying the safety communication cycle, details will not be described because an existing method is applied, as with the communication cycle verification unit 10008 of the safety master device 10.

As described above, the communication cycle verification unit 20008, together with the checksum negotiation unit 10005 and the communication cycle verification unit 10008, corresponds to the determination unit. Also, the process performed by the communication cycle verification unit 20008, together with the process performed by the checksum negotiation unit 10005 and the process performed by the communication cycle verification unit 10008, corresponds to the determination process.

\*\*\*Description of Operation\*\*\*

Figure 6:
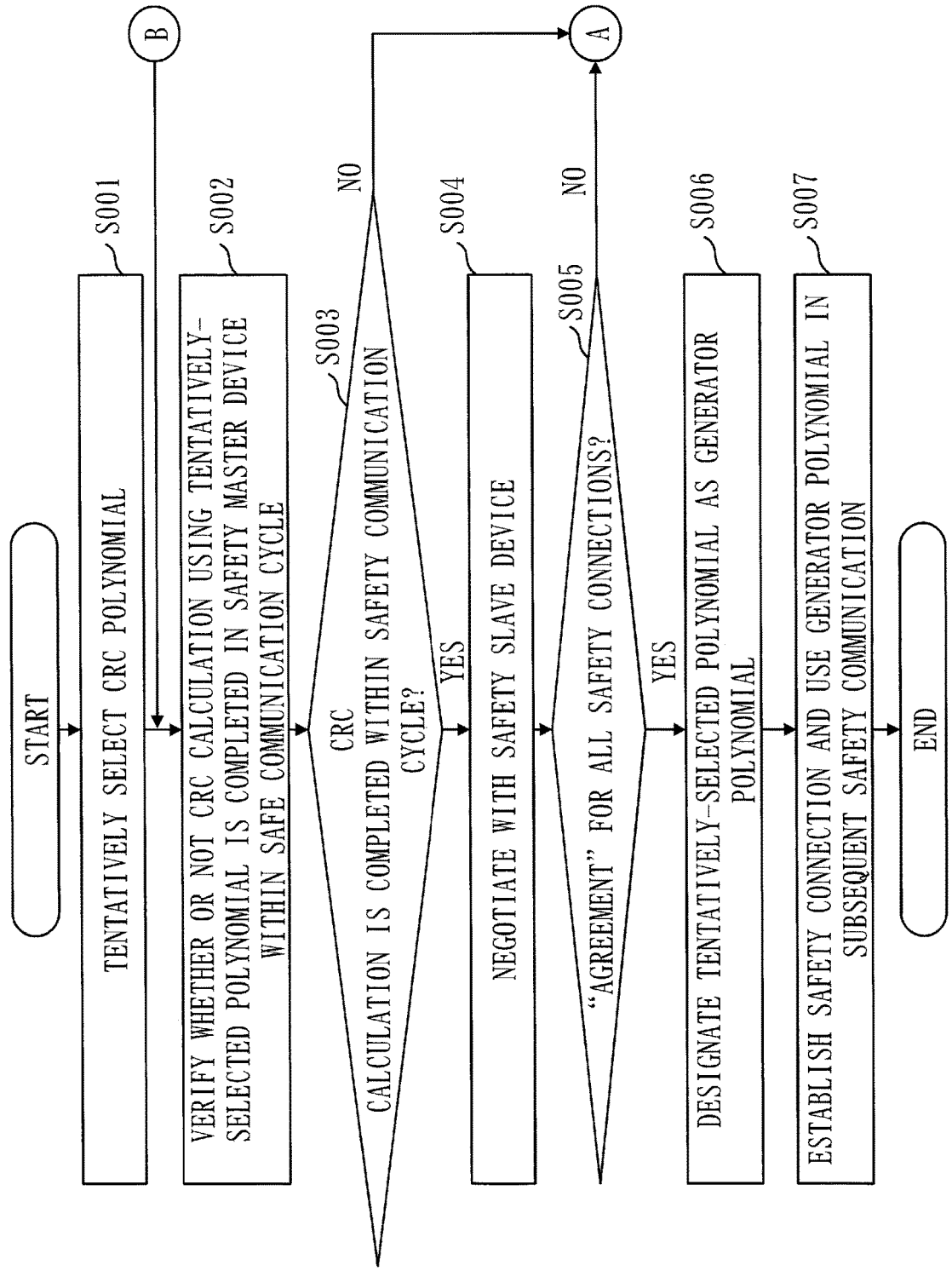
FIG. 6 is a flowchart illustrating a process of establishing a safety connection according to the first embodiment.
Figure 7:
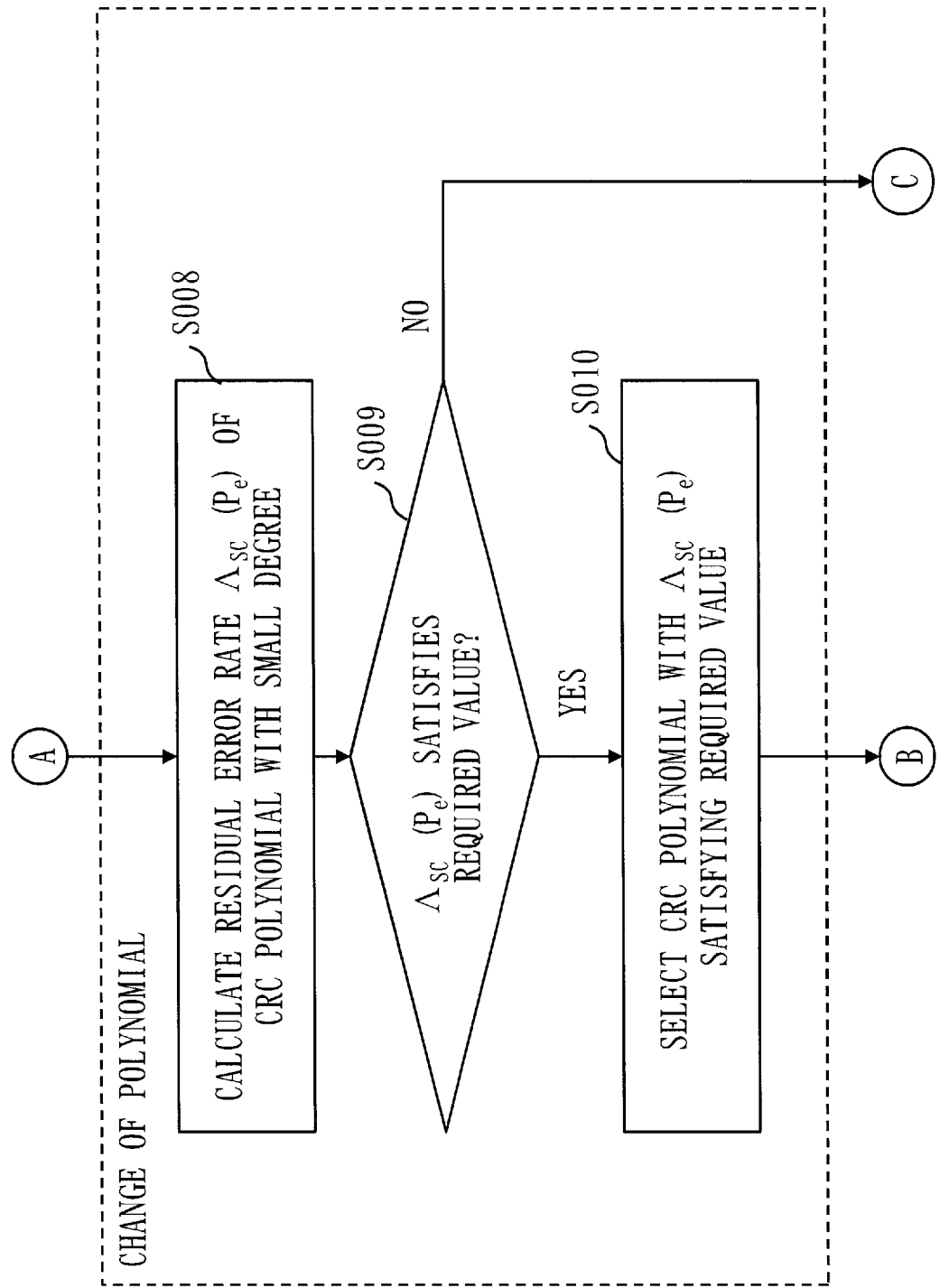
FIG. 7 is a flowchart illustrating the process of establishing the safety connection according to the first embodiment.
Figure 8:
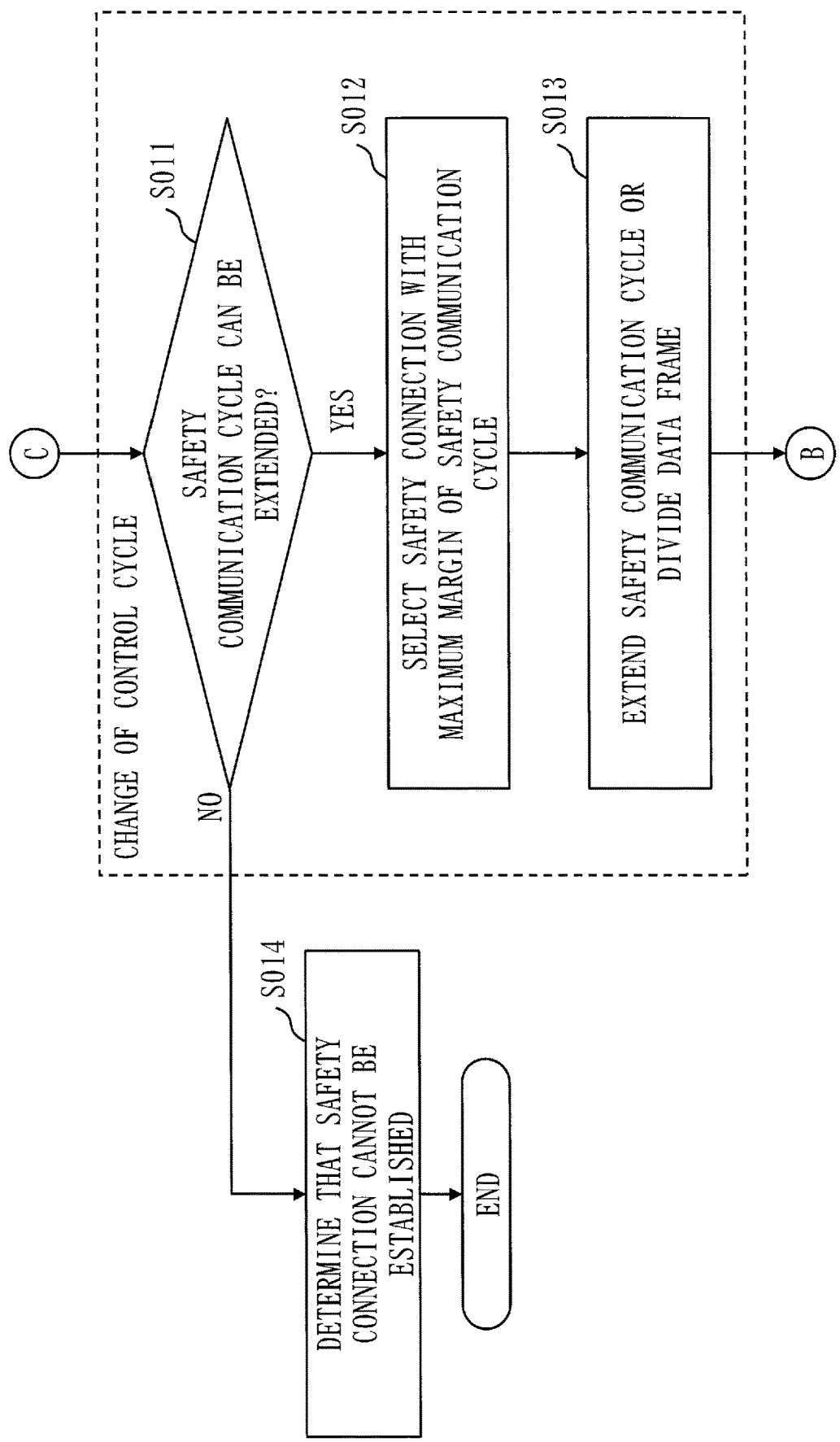
FIG. 8 is a flowchart illustrating the process of establishing the safety connection according to the first embodiment.

FIGS. 6, 7 and 8 are flowcharts illustrating processes of establishing the safety connection according to the present embodiment.

Processes illustrated in FIGS. 6, 7, and 8 correspond to an information processing method and processes of an information processing program of the present application.

In step S001, the checksum negotiation unit 10005 of the safety master device 10 that leads establishment of the safety connection tentatively selects a CRC polynomial candidate based on the safety parameters.

The safety master device 10 manages a plurality of CRC polynomials, for example, in a CRC polynomial table illustrated in FIG. 9. In the CRC polynomial table of FIG. 9, a degree, a minimum Hamming distance, and a distribution coefficient are illustrated for each CRC polynomial. By using the CRC polynomial table of FIG. 9, the residual error rate can be calculated under conditions of a specific frame length and a specific bit error rate.

It is considered that in step S001, for example, the checksum negotiation unit 10005 selects the CRC polynomial with a maximum degree in order to give the residual error rate a margin.

In step S002, the communication cycle verification unit 10008 verifies whether or not the CRC calculation using the tentatively-selected polynomial is completed in the safety master device 10 within the safety communication cycle.

At this time, the communication cycle verification unit 10008 verifies by considering a whole process to be executed as the safety master device 10, whether or not the generation process and the inspection process of the safety PDU of the safety connection are completed within a set safety communication cycle, the generation process including generation of a checksum.

As described above, the communication cycle verification unit 10008 can perform the verification by using the calculation equation generated in consideration of the whole process of the safety master device 10. The communication cycle verification unit 10008 can also perform the verification by performing a simulation. Furthermore, the communication cycle verification unit 10008 can also emulate the actual process operation, measure a process time, and perform the verification. The communication cycle verification unit 10008 can perform the verification by using any of existing verification methods.

If the CRC calculation using the tentatively-selected polynomial is completed within the safety communication cycle (YES in step S003), the process proceeds to step S004. On the other hand, if the CRC calculation using the tentatively-selected polynomial is not completed within the safety communication cycle (NO in step S003), the process proceeds to step S008.

In step S004, the checksum negotiation unit 10005 negotiates with the opposing safety slave device 20 that generates the safety connection, whether or not the tentatively-selected polynomial is usable.

Specifically, the checksum negotiation unit 10005 transmits to the safety slave device 20, a message including the identification information of the tentatively-selected polynomial.

Step S004 is implemented for all the safety slave devices 20 that establish the safety connections with the safety master device 10.

In the safety slave device 20, the checksum negotiation unit 20005 receives the message. Then, the checksum negotiation unit 20005 instructs the communication cycle verification unit 20008 to verify the tentatively-selected polynomial.

The communication cycle verification unit 20008 verifies the tentatively-selected polynomial, according to the instruction from the checksum negotiation unit 20005. Specifically, the communication cycle verification unit 20008 verifies whether or not the safety slave device 20 is supported for the CRC calculation using the tentatively-selected polynomial.

When the safety slave device 20 is supported for the CRC calculation using the tentatively-selected polynomial, the communication cycle verification unit 20008 verifies in consideration of influence on other processes, whether or not the generation process and the inspection process of the safety PDU using the tentatively-selected polynomial are completed in the safety slave device 20 within the safety communication cycle.

If there is no problem in both of above two verifications, the checksum negotiation unit 20005 transmits a response message indicating "agreement" to the safety master device 10. On the other hand, if there is a problem in at least any one of the above two verifications, the checksum negotiation unit 20005 transmits the response message indicating "agreement failure" to the safety master device 10.

In step S005, the checksum negotiation unit 10005 checks the response message from the safety slave device 20, and if the checksum negotiation unit 10005 receives the response message indicating "agreement" for all safety connections (YES in step S005), the process proceeds to step S006. On the other hand, if the checksum negotiation unit 10005 receives the response message indicating "agreement failure" (NO in step S005), the process proceeds to step S008.

In step S006, the checksum negotiation unit 10005 designates the tentatively-selected polynomial as the generator polynomial used for communication between the safety master device 10 and all the safety slave devices 20.

Then, the checksum negotiation unit 10005 transmits to checksum negotiation units 20005 of all the safety slave devices 20, a message to notify that the tentatively-selected polynomial designated as the generator polynomial is used for the safety communication.

In step S007, the safety connection establishment processing unit 1002 of the safety master device 10 and the safety connection establishment processing unit 2002 of the safety slave device 20 establish the safety connection, and then the safety communication is performed using the generator polynomial designated in step S006.

The following steps S008 to S010 are phases in which a change of the tentatively-selected polynomial is considered when it is found that the CRC calculation using the tentatively-selected polynomial cannot be completed within the safety communication cycle.

In step S008, the checksum negotiation unit 10005 calculates the residual error rate $\Lambda_{SC}(P_e)$ for each safety connection when a CRC polynomial with a degree smaller than the tentatively-selected polynomial is applied. The checksum negotiation unit 10005 calculates the residual error rate $\Lambda_{SC}(P_e)$ using the calculation method defined by the international standard for the safety communication. In the present embodiment, descriptions of a specific method for calculating the residual error rate $\Lambda_{SC}(P_e)$ are omitted. The checksum negotiation unit 10005 uses the values of the safety parameters for the values such as the safety communication cycle, the bit error rate, and the like necessary for the calculation.

Besides, in step S008 and subsequent steps, a new tentatively-selected polynomial and a formal generator polynomial do not have to be the same for all safety connections.

In step S009, the checksum negotiation unit 10005 determines whether or not the residual error rate $\Lambda_{SC}$ ($P_e$) obtained in step S008 described above satisfies the required value. In the present embodiment, this required value is a required value defined by the international standard for the safety communication. Therefore, in the present embodiment, a specific value of the required value is not mentioned.

In a case where the residual error rate $\Lambda_{SC}$ ($P_e$) satisfies the required value (YES in step S009), that is, in a case where even if the CRC polynomial is changed to a CRC polynomial with a small degree, the residual error rate $\Lambda_{SC}$ ($P_e$) satisfies the required value of the safety degree level, the process proceeds to step S010. On the other hand, if the residual error rate $\Lambda_{SC}$ ($P_e$) does not satisfy the required value (NO in step S009), the process proceeds to S011.

In step S010, the checksum negotiation unit 10005 selects as the new tentatively-selected polynomial, a CRC polynomial with a degree smaller than that of a current tentatively-selected polynomial and with a value of the residual error rate $\Lambda_{SC}$ ($P_e$) satisfying the required value.

After that, the process of step S002 and the processes after step S002 are performed for the new tentatively-selected polynomial. That is, it is verified whether or not the calculation using the new tentatively-selected polynomial is completed in each of the safety master device 10 and the safety slave device 20 within the safety communication cycle.

The following steps S011 to S013 are phases for considering an extension of the safety communication cycle.

Specifically, in steps S011 to S013, the extension of the safety communication cycle is considered, when the calculation using the tentatively-selected polynomial is not completed within the safety communication cycle (NO in step S003), or when the response message indicating "agreement failure" is received from any of safety slave devices 20 (NO in step S005), and further, when there is no CRC polynomial with a small degree and with the residual error rate $\Lambda_{SC}$ ($P_e$) satisfying the required value (NO in step S009).

In step S011, the checksum negotiation unit 10005 determines whether or not the safety communication cycle can be extended for each of safety connections. That is, the checksum negotiation unit 10005 determines whether or not a necessary safety response time and availability can be maintained even if the safety communication cycle of the safety connection is extended.

Specifically, the checksum negotiation unit 10005 determines whether or not the safety communication cycle can be extended by applying above-described (equation 1) and (equation 2).

If there is the safety connection for which the safety communication cycle can be extended (YES in step S011), the process proceeds to S012. On the other hand, if there is no safety connection for which the safety communication cycle cannot be extended (NO in step S011), the process proceeds to S014.

In step S012, the checksum negotiation unit 10005 selects the safety connection having a maximum margin in a ratio of allowing an extension of the safety communication cycle.

In step S013, the checksum negotiation unit 10005 performs the extension of the safety communication cycle or division of a data frame, for the safety connection selected in step S012.

The checksum negotiation unit 10005 can extend the safety communication cycle as long as the above-described (equation 1) and (equation 2) are satisfied.

The checksum negotiation unit 10005 selects as the new tentatively-selected polynomial, the current tentatively-selected polynomial of the safety connection selected in step S012. And, the process of step S002 and processes after step S002 are performed using a safety communication cycle which is extended in relation with the new tentatively-selected polynomial. That is, it is verified whether or not the calculation using the new tentatively-selected polynomial is completed in each of the safety master device 10 and the safety slave device 20 within the extended safety communication cycle.

Further, calculation time is shortened by dividing the data frame. That is, the checksum negotiation unit 10005 shortens a frame length of each data frame by dividing the data frame, and lengthens a substantial interval until all of divided data frames obtained by the division arrive at a communication destination. As a result, it becomes possible to use the CRC polynomial with a small degree, and the calculation time can be shortened.

The checksum negotiation unit 10005 selects as a new tentatively-selected polynomial, the current tentatively-selected polynomial of the safety connection selected in step S012. Then, the process of step S002 and the processes after step S002 are performed using the new tentatively-selected polynomial for the divided data frames. That is, it is verified whether or not the calculation using the new tentatively-selected polynomial for the divided data frames is completed in each of the safety master device 10 and the safety slave device 20 within the safety communication cycle.

In step S014, it is found that a safety communication setting is set, which is not implementable for a reason of process performance of the safety master device 10 or the safety slave device 20. Therefore, the checksum negotiation unit 10005 determines that the safety connection cannot be established, and notifies a user of the safety master device 10 of that fact.

\*\*\*Description of Effect of Embodiment\*\*\*

As described above, in the present embodiment, it is determined whether or not the calculation using the tentatively-selected polynomial is completed in each of the safety master device 10 and the safety slave device 20 within the safety communication cycle. Then, if the calculation using the tentatively-selected polynomial is completed in each of the safety master device 10 and the safety slave device 20 within the safety communication cycle, the tentatively-selected polynomial is designated as the generator polynomial. Therefore, according to the present embodiment, it is possible to designate the generator polynomial which enables the CRC calculation to be completed within the safety communication cycle even under a condition where the calculation resources are limited.

Second Embodiment

In the first embodiment, the safety master device 10 causes the safety slave device 20 to determine whether or not the calculation using the tentatively-selected polynomial is completed within the safety communication cycle, and designates the generator polynomial.

In the present embodiment, an example will be described in which the safety master device 10 determines whether or not the calculation using the tentatively-selected polynomial is completed in the safety slave device 20 within the safety communication cycle. More specifically, in the present embodiment, the safety master device 10 acquires from the safety slave device 20, information (hereinafter, calculation ability information) regarding calculation ability of the safety slave device 20. Then, the safety master device 10 determines based on the calculation ability information of the safety slave device 20, whether or not the calculation using the tentatively-selected polynomial is completed in the safety slave device 20 within the safety communication cycle.

\*\*\*Description of Configuration\*\*\*

A configuration example of the safety communication system according to the present embodiment is as illustrated in FIG. 1.

Also, a hardware configuration example of the safety master device 10 according to the present embodiment is as illustrated in FIG. 2.

Also, a hardware configuration example of the safety slave device 20 according to the present embodiment is as illustrated in FIG. 3.

Also, a functional configuration example of the safety master device 10 according to the present embodiment is as illustrated in FIG. 4.

Also, a functional configuration example of the safety slave device 20 according to the present embodiment is as illustrated in FIG. 5.

Besides, although in the first embodiment, the checksum negotiation unit 10005, the communication cycle verification unit 10008, and the communication cycle verification unit 20008 correspond to the determination unit, in the present embodiment, only the checksum negotiation unit 10005 and the communication cycle verification unit 10008 correspond to the determination unit. Further, although in the first embodiment, the checksum negotiation unit 10005, the communication cycle verification unit 10008, and the communication cycle verification unit 20008 configure the information processing device, in the present embodiment, the checksum negotiation unit 10005 and the communication cycle verification unit 10008 configure the information processing device.

\*\*\*Description of Operation\*\*\*

Figure 10:
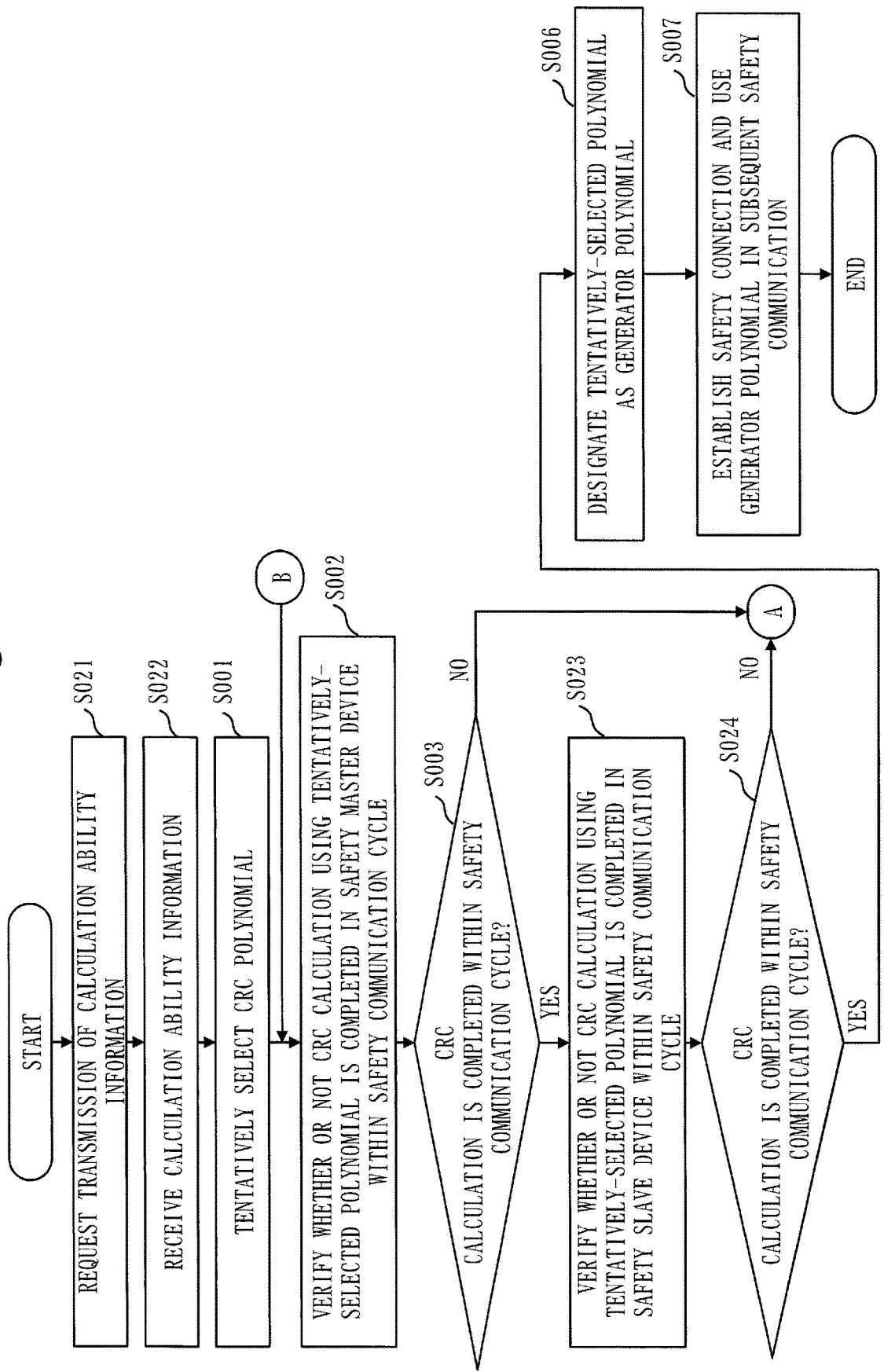
FIG. 10 is a flowchart illustrating a process of establishing a safety connection according to a second embodiment.

The process of establishing the safety connection according to the present embodiment is as illustrated in FIG. 10. In FIG. 10, processes with the same reference numerals as in FIG. 6 are the same as those illustrated in FIG. 6. Below, differences from the first embodiment will be mainly described. Matters not described below are the same as those in the first embodiment.

The processes illustrated in FIG. 10 correspond to an information processing method and processes of the information processing program of the present application.

In step S021, the checksum negotiation unit 10005 of the safety master device 10 requests all the safety slave devices 20 that perform the safety communication to transmit the calculation ability information for each CRC polynomial.

The checksum negotiation unit 20005 of each safety slave device 20 instructs the communication cycle verification unit 20008 to generate the calculation ability information. The communication cycle verification unit 20008 generates the calculation ability information and transmits the generated calculation ability information to the safety master device 10. The calculation ability information is information that indicates the communication cycle that the safety slave device 20 realizes when each CRC polynomial is applied. FIG. 11 illustrates an example of the calculation ability information. Since the calculation ability varies depending on the process to be executed by the safety slave device 20 in the safety communication system, the "realizable communication cycle" illustrated in FIG. 11 is not always a fixed value.

In step S022, the checksum negotiation unit 10005 of the safety master device 10 receives the calculation ability information from the safety slave device 20.

In step S001, the checksum negotiation unit 10005 tentatively selects a CRC polynomial candidate. The checksum negotiation unit 10005 selects, for example, a CRC polynomial with a maximum degree as with the first embodiment.

In step S002, as with the first embodiment, the communication cycle verification unit 10008 verifies whether or not the CRC calculation using the tentatively-selected polynomial is completed in the safety master device 10 within the safety communication cycle.

If the CRC calculation using the tentatively-selected polynomial is completed within the safety communication cycle (YES in step S003), the process proceeds to step S023. On the other hand, if the CRC calculation using the tentatively-selected polynomial is not completed within the safety communication cycle (NO in step S003), the process proceeds to step S008. Since the process of step S008 and the processes after step S008 are as described in the first embodiment, explanations thereof are omitted.

In step S023, the communication cycle verification unit 10008 verifies based on the calculation ability information received in step S022, whether or not the CRC calculation using the tentatively-selected polynomial is completed in the safety slave device 20 within the safety communication cycle.

Step S023 is implemented for all the safety slave devices 20 that establish the safety connections with the safety master device 10.

If the CRC calculation using the tentatively-selected polynomial is completed within the safety communication cycle (YES in step S024), the process proceeds to step S006. On the other hand, if the CRC calculation using the tentatively-selected polynomial is not completed within the safety communication cycle (NO in step S024), the process proceeds to step S008. Since the process of step S006 and the processes after step S006 and the process of step S008 and the processes after step S008 are as described in the first embodiment, explanations thereof are omitted.

\*\*\*Description of Effect of Embodiment\*\*\*

In the present embodiment, the safety master device 10 verifies whether or not the CRC calculation in the safety slave device 20 is completed within the safety communication cycle. That is, it is verified whether or not the CRC calculation in the safety slave device 20 is completed within the safety communication cycle without using the calculation resources of the safety slave device 20. Therefore, according to the present embodiment, even if the calculation resources of the safety slave device 20 are limited, it is possible to designate the generator polynomial which enables the CRC calculation to be completed within the safety communication cycle.

Third Embodiment

In the first and second embodiments, in the safety master device 10, as illustrated in the CRC polynomial table of FIG. 9, a single CRC polynomial is managed as a choice of the tentatively-selected polynomial.

In the present embodiment, as illustrated in a CRC polynomial table of FIG. 12, a combination of a plurality of CRC polynomials are managed as choices of the tentatively-selected polynomial. That is, in the present embodiment, a plurality of different checksums are added to one safety PDU.

When hardware on which the safety communication layer 1000 operates and hardware on which the safety communication layer 2000 operates are multiplexed, the checksums can be calculated in parallel. Therefore, adding a plurality of checksums generated using CRC polynomials with a small degree to the safety PDU is considered to be more desirable than adding a single checksum generated using a CRC polynomial with a large degree to the safety PDU. That is, when the plurality of checksums generated using the CRC polynomials with the small degree are added to the safety PDU, the calculation time can be shortened while ensuring a same residual error rate as a residual error rate in a case where the single checksum generated using the CRC polynomial with the large degree is added to the safety PDU. Thus, it is considered to increase the choices of the tentatively-selected polynomial through an expansion of the CRC polynomial table as illustrated in FIG. 12.

Fourth Embodiment

In the first embodiment, at a time of establishing the safety connection, the safety master device 10 performs the processes illustrated in FIGS. 6 to 8 to designate the generator polynomial.

However, a result of the processes illustrated in FIGS. 6 to 8 is the same result every time, if there is no change in a configuration of the safety communication system, the safety parameters, and a condition of the network 30. Therefore, if the processes illustrated in FIGS. 6 to 8 are performed and the generator polynomial is designated in advance for each safety connection, according to the configuration of the safety communication system, the safety parameter, and the condition of the network 30, it is not necessary to repeat the processes illustrated in FIGS. 6 to 8 every time the safety connection is to be established.

In the present embodiment, an example will be described in which an information processing device different from the safety master device 10 performs the processes illustrated in FIGS. 6 to 8 to designate in advance the generator polynomial.

Then, the information processing device notifies the safety master device 10 of the designated generator polynomial. The safety master device 10 applies the generator polynomial notified from the information processing device to the safety communication.

*Description of Configuration*

Figure 13:
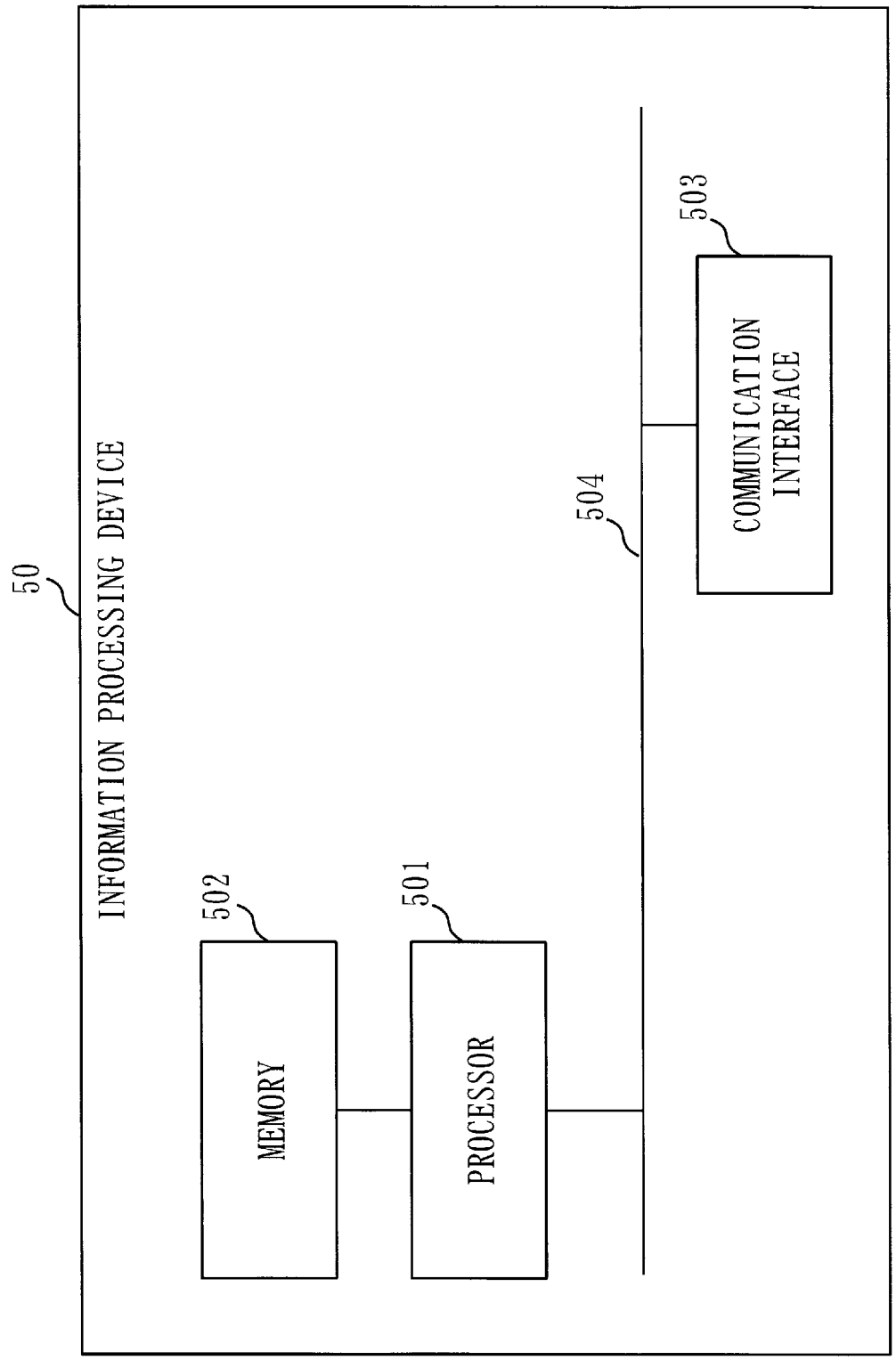
FIG. 13 is a diagram illustrating a hardware configuration example of an information processing device according to a fourth embodiment.

FIG. 13 illustrates a hardware configuration example of an information processing device 50 according to the present embodiment.

The information processing device 50 includes a processor 501, a memory 502, a communication interface 503, and a bus 504 connecting these.

The information processing device 50 is a computer.

The processor 501 executes a selection unit 5001, a determination unit 5002, and a designation unit 5003 expanded on the memory 102, which will be described later.

The selection unit 5001, the determination unit 5002, and the designation unit 5003 are implemented, for example, by a program.

The communication interface 503 notifies the safety master device 10 of the designated generator polynomial.

Figure 14:
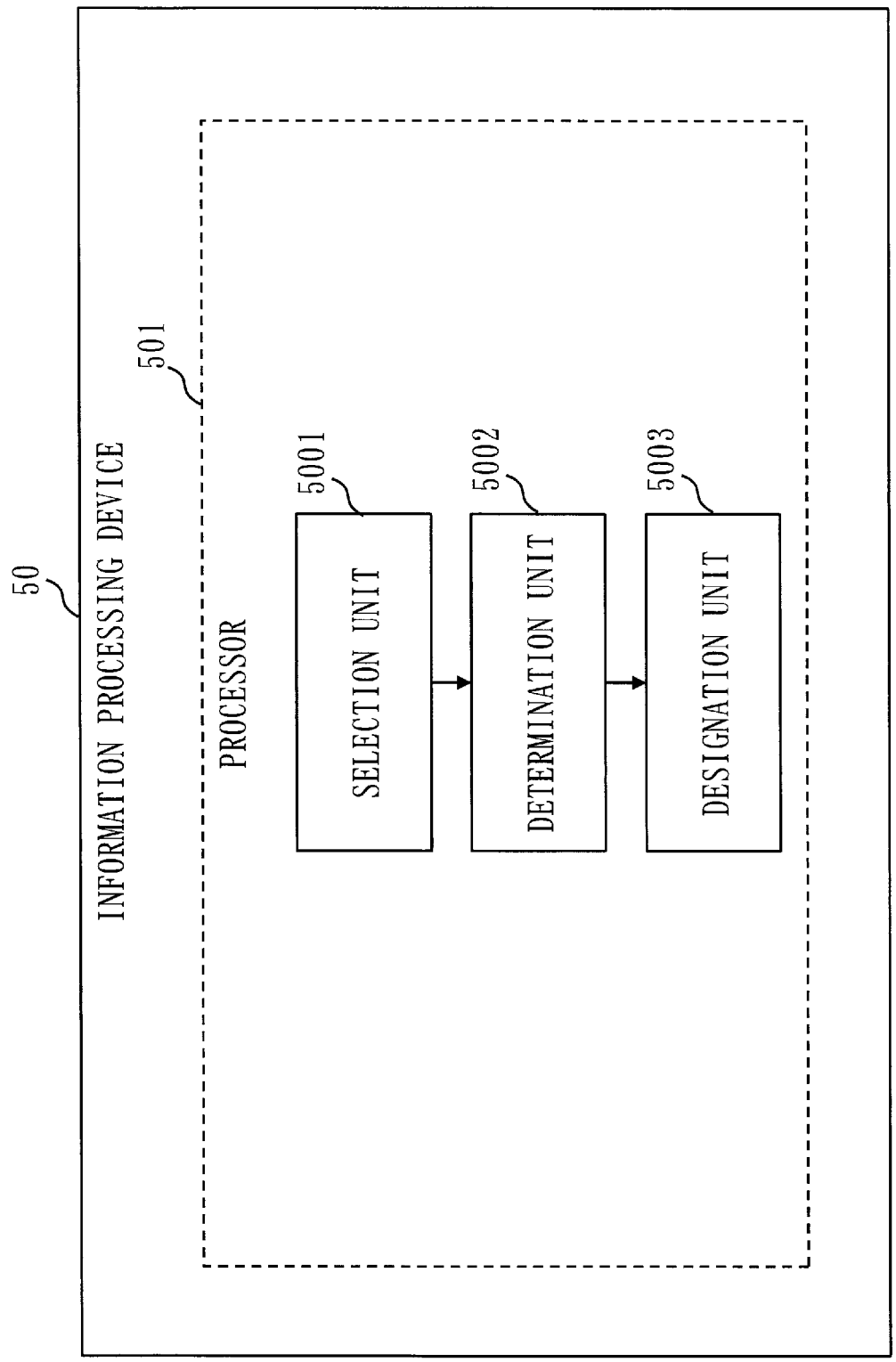
FIG. 14 is a diagram illustrating a functional configuration example of the information processing device according to the fourth embodiment.

FIG. 14 illustrates a functional configuration example of the information processing device 50.

The information processing device 50 includes the selection unit 5001, the determination unit 5002, and the designation unit 5003.

FIG. 14 schematically represents a state in which the processor 501 is executing the program that implements functions of the selection unit 5001, the determination unit 5002, and the designation unit 5003.

The selection unit 5001 selects from a plurality of CRC polynomials, a candidate for a generator polynomial to be used in communication between the safety master device 10 and the safety slave device 20. Also, in the present embodiment, the CRC polynomial selected by the selection unit 5001 is referred to as the tentatively-selected polynomial.

A process performed by the selection unit 5001 corresponds to the selection process.

The determination unit 5002 determines whether or not a calculation using the tentatively-selected polynomial is completed in each of the safety master device 10 and the safety slave device 20 within the safety communication cycle.

The determination unit 5002 holds, for example, the calculation ability information illustrated in FIG. 11 for the safety master device 10 and each safety slave device 20. Then, the determination unit 5002 determines by using the calculation ability information, whether or not the calculation using the tentatively-selected polynomial is completed in each of the safety master device 10 and the safety slave device 20 within the safety communication cycle.

A process performed by the determination unit 5002 corresponds to the determination process.

If it is determined by the determination unit 5002 that the calculation using the tentatively-selected polynomial is completed in each of the safety master device 10 and the safety slave device 20 within the safety communication cycle, the designation unit 5003 designates the tentatively-selected polynomial as the generator polynomial.

Further, the designation unit 5003 notifies the safety master device 10 of the designated generator polynomial via the communication interface 503.

A process performed by the designation unit 5003 corresponds to the designation process.

*Description of Operation*

Figure 15:
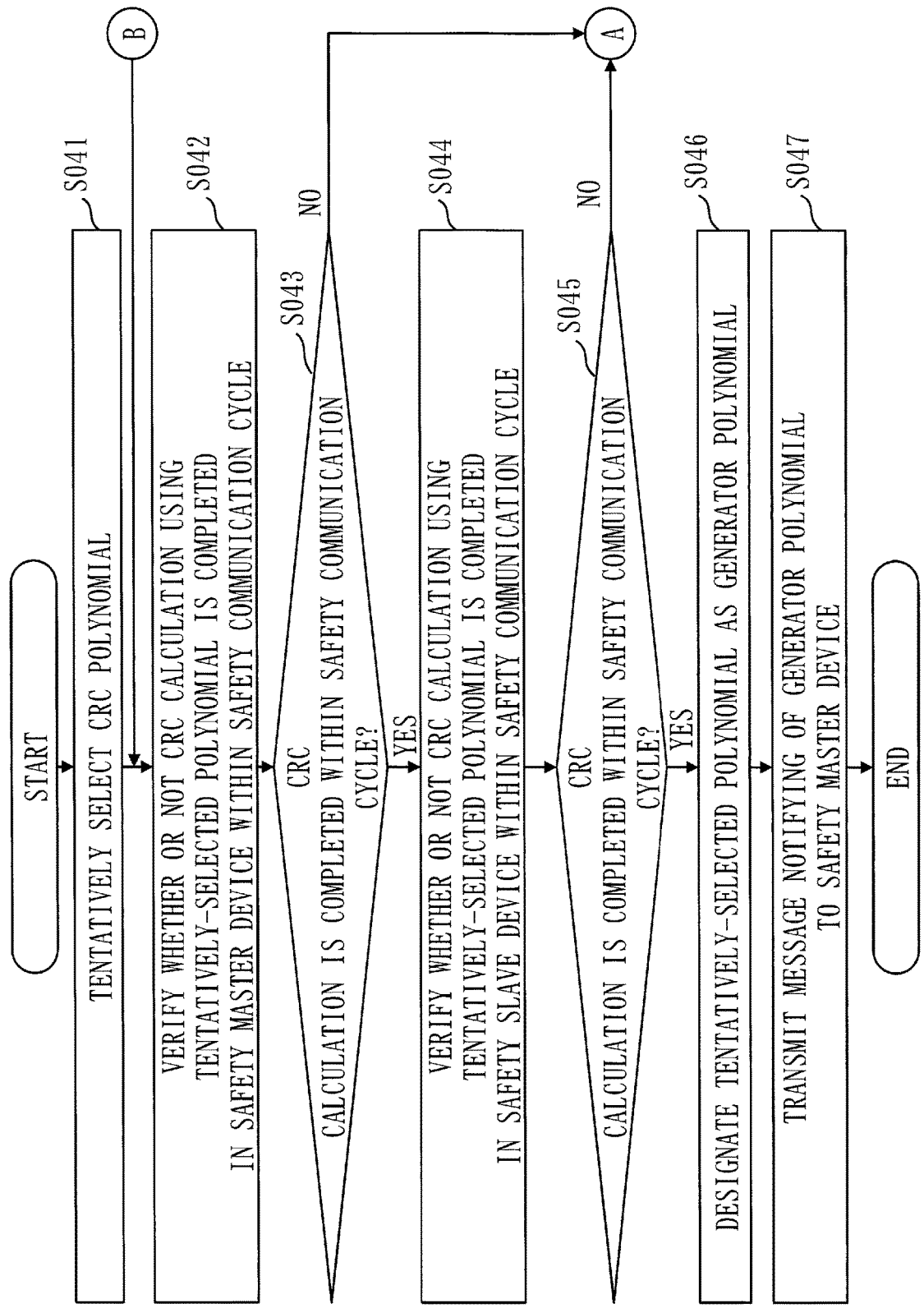
FIG. 15 is a flowchart illustrating an operational example of the information processing device according to the fourth embodiment.

FIG. 15 illustrates an operational example of the information processing device 500 according to the present embodiment.

Processes illustrated in FIG. 15 correspond to the information processing method and processes of the information processing program of the present application.

In step S041, the selection unit 5001 tentatively selects a CRC polynomial candidate. The selection unit 5001 selects, for example, a CRC polynomial with a maximum degree as with step S001 of the first embodiment.

In step S042, the determination unit 5002 verifies based on the calculation ability information on the safety master device 10, whether or not the CRC calculation using the tentatively-selected polynomial is completed in the safety master device 10 within the safety communication cycle.

If the CRC calculation using the tentatively-selected polynomial is completed in the safety master device 10 within the safety communication cycle (YES in step S043), the process proceeds to step S044. On the other hand, if the CRC calculation using the tentatively-selected polynomial is not completed within the safety communication cycle (NO in step S043), the process proceeds to step S008 in FIG. 7.

In step S044, the determination unit 5002 verifies based on the calculation ability information on the safety slave device 20, whether or not the CRC calculation using the tentatively-selected polynomial is completed in the safety slave device 20 within the safety communication cycle.

Step S044 is implemented for all the safety slave devices 20 that establish the safety connections with the safety master device 10.

If the CRC calculation using the tentatively-selected polynomial is completed in all the safety slave devices 20 within the safety communication cycle (YES in step S045), the process proceeds to step S046. On the other hand, if the CRC calculation using the tentatively-selected polynomial is not completed in any safety slave device 20 within the safety communication cycle (NO in step S045), the process proceeds to step S008 in FIG. 7.

In step S046, the designation unit 5003 designates the tentatively-selected polynomial as the generator polynomial used in communication between the safety master device 10 and all the safety slave devices 20.

Then, the designation unit 5003 transmits a message notifying of the designated generator polynomial to the safety master device 10 in step S047.

In the present embodiment, in step S008 of FIG. 7, the determination unit 5002 calculates the residual error rate $\Lambda_{SC}(P_e)$ for each of the safety connections when a CRC polynomial with a degree smaller than the tentatively-selected polynomial is applied. The designation unit 5003 calculates the residual error rate $\Lambda_{SC}(P_e)$ using the calculation method defined by the international standard for the safety communication. In the present embodiment, descriptions of a specific method for calculating the residual error rate $\Lambda_{SC}(P_e)$ are omitted. The designation unit 5003 uses the values of the safety parameters for the values such as the safety communication cycle, the bit error rate, and the like necessary for the calculation.

Besides, in step S008 and subsequent steps, the new tentatively-selected polynomial and a formal generator polynomial do not have to be the same for all the safety connections.

In step S009, the determination unit 5002 determines whether or not the residual error rate $\Lambda_{SC}(P_e)$ obtained in step S008 described above satisfies the required value. In the present embodiment, this required value is a required value defined by the international standard for the safety communication. Therefore, in the present embodiment, a specific value of the required value is not mentioned.

In a case where the residual error rate $\Lambda_{SC}(P_e)$ satisfies the required value (YES in step S009), that is, in a case where even if the CRC polynomial is changed to a CRC polynomial with a smaller degree, the residual error rate $\Lambda_{SC}(P_e)$ satisfies the required value of the safety degree level, the process proceeds to step S010. On the other hand, if the residual error rate $\Lambda_{SC}(P_e)$ does not satisfy the required value (NO in step S009), the process proceeds to S011.

In step S010, the determination unit 5002 selects as the new tentatively-selected polynomial, a CRC polynomial with a degree smaller than that of a current tentatively-selected polynomial and with the value of the residual error rate $\Lambda_{SC}(P_e)$ satisfying the required value.

After that, the process of step S042 and the processes after step S042 are performed for the new tentatively-selected polynomial. That is, it is verified whether or not the calculation using the new tentatively-selected polynomial is completed in each of the safety master device 10 and the safety slave device 20 within the safety communication cycle.

In steps S011 to S013, an extension of the safety communication cycle is considered, when the calculation using the tentatively-selected polynomial is not completed within the safety communication cycle (NO in step S043), or when the response message indicating "agreement failure" is received from any of the safety slave devices 20 (NO in step S045), and further, when there is no CRC polynomial with the residual error rate $\Lambda_{SC}(P_e)$ satisfying the required value (NO in step S009).

In step S011, the determination unit 5002 determines whether or not the safety communication cycle can be extended for each of the safety connections. That is, the determination unit 5002 determines whether or not a necessary safety response time and availability can be maintained even if the safety communication cycle of the safety connection is extended.

Specifically, the determination unit 5002 determines whether or not the safety communication cycle can be extended by applying the above-described (equation 1) and (equation 2).

If there is a safety connection for which the safety communication cycle can be extended (YES in step S011), the process proceeds to S012. On the other hand, if there is no safety connection for which the safety communication cycle can be extended (NO in step S011), the process proceeds to S014.

In step S012, the determination unit 5002 selects the safety connection having a maximum margin in a ratio of allowing an extension of the safety communication cycle.

In step S013, the determination unit 5002 performs the extension of the safety communication cycle or division of a data frame, for the safety connection selected in step S012.

The determination unit 5002 can extend the safety communication cycle as long as the above-described (equation 1) and (equation 2) are satisfied.

The determination unit 5002 selects as a new tentatively-selected polynomial, the current tentatively-selected polynomial of the safety connection selected in step S012. Then, the process of step S002 and the processes after step S002 are performed using a safety communication cycle which is extended in relation with the new tentatively-selected polynomial. That is, it is verified whether or not the calculation using the new tentatively-selected polynomial is completed in each of the safety master device 10 and the safety slave device 20 within the extended safety communication cycle.

Further, calculation time is shortened by dividing the data frame. That is, the determination unit 5002 shortens a frame length of each data frame by dividing the data frame, and lengthens a substantial interval until all of divided data frames obtained by the division arrive at a communication destination. As a result, it becomes possible to use the CRC polynomial with a small degree, and the calculation time can be shortened.

The determination unit 5002 selects as the new tentatively-selected polynomial, the current tentatively-selected polynomial of the safety connection selected in step S012. Then, the process of step S002 and the processes after step S002 are performed using the new tentatively-selected polynomial for the divided data frames. That is, it is verified whether or not the calculation using the new tentatively-selected polynomial for the divided data frames is completed in each of the safety master device 10 and the safety slave device 20 within the safety communication cycle.

In step S014, it is found that a safety communication setting is set, which is not implementable for a reason of process performance of the safety master device 10 or the safety slave device 20. Therefore, the determination unit 5002 determines that the safety connection cannot be established, and notifies the safety master device 10 of that fact.

*Description of Effect of Embodiment*

In the present embodiment, the information processing device 50 verifies whether or not the CRC calculations in the safety master device 10 and the safety slave device 20 are completed within the safety communication cycle. That is, it is verified whether or not the CRC calculations in the safety master device 10 and the safety slave device 20 are completed within the safety communication cycle without using calculation resources of the safety master device 10 and the safety slave device 20. Therefore, according to the present embodiment, even if the calculation resources of the safety master device 10 and the safety slave device 20 are limited, it is possible to designate the generator polynomial which enables the CRC calculation to be completed within the safety communication cycle.

Although the embodiments of the present invention have been described above, two or more of these embodiments may be combined to implement.

Alternatively, one of these embodiments may be partially implemented.

Alternatively, two or more of these embodiments may be partially combined to implement.

Besides, the present invention is not limited to these embodiments, and various modifications can be made if necessary.

*Description of Hardware Configuration*

Finally, supplementary descriptions of hardware configurations of the safety master device 10, the safety slave device 20, and the information processing device 50 will be given.

The processor 101, the processor 201, and the processor 501 are ICs (Integrated Circuits) that perform processing.

The processor 101, the processor 201, and the processor 501 are CPUs (Central Processing Units), DSPs (Digital Signal Processors), or the like.

The memory 102, the memory 202, and the memory 502 are RAMs (Random Access Memories), ROMs (Read Only Memories), flash memories, HDDs (Hard Disk Drives), or the like.

The field communication interface 104, the field communication interface 204, and the communication interface 503 are electronic circuits that execute communication processes of data.

The field communication interface 104, the field communication interface 204, and the communication interface 503 are, for example, communication chips or NICs (Network Interface Cards).

Further, in the memory 102, an OS (Operating System) is also stored.

Then, at least a part of the OS is executed by the processor 101.

While executing at least the part of the OS, the processor 101 executes a program that implements functions of the safety communication layer 1000 and the fieldbus application layer 1001.

The processor 101 executes the OS so that task management, memory management, file management, communication control, and the like are performed.

Also, at least any of information, data, a signal value, and a variable value indicating processing results of the safety communication layer 1000 and the fieldbus application layer 1001 is stored in at least any of the memory 102, a register in the processor 101, and a cache memory in the processor 101.

Also, the program that implements the functions of the safety communication layer 1000 and the fieldbus application layer 1001 may be stored in a portable storage medium such as a magnetic disk, a flexible disk, an optical disk, a compact disk, a Blu-ray (registered trademark) disk, a DVD, or the like.

Further, also in the memory 202, an OS is stored.

Then, at least a part of the OS is executed by the processor 201.

While executing at least the part of the OS, the processor 201 executes a program that implements functions of the safety communication layer 2000 and the fieldbus application layer 2001.

The processor 201 executes the OS so that task management, memory management, file management, communication control, and the like are performed.

Also, at least any of information, data, a signal value, and a variable value indicating processing results of the safety communication layer 2000 and the fieldbus application layer 2001 is stored in at least any of the memory 202, a register in the processor 201, and a cache memory in the processor 201.

Also, the program that implements the functions of the safety communication layer 2000 and the fieldbus application layer 2001 may be stored in a portable storage medium such as a magnetic disk, a flexible disk, an optical disk, a compact disk, a Blu-ray (registered trademark) disk, a DVD, or the like.

Further, also in the memory 502, an OS is stored.

Then, at least a part of the OS is executed by the processor 501.

While executing at least the part of the OS, the processor 501 executes a program that implements functions of the selection unit 5001, the determination unit 5002, and the designation unit 5003.

The processor 501 executes the OS so that task management, memory management, file management, communication control, and the like are performed.

Also, at least any of information, data, a signal value, and a variable value indicating processing results of the selection unit 5001, the determination unit 5002, and the designation unit 5003 is stored in at least any of the memory 502, a register in the processor 501, and a cache memory in the processor 501.

Also, the program that implements the functions of the selection unit 5001, the determination unit 5002, and the designation unit 5003 may be stored in a portable storage medium such as a magnetic disk, a flexible disk, an optical disk, a compact disk, a Blu-ray (registered trademark) disk, a DVD or the like.

Also, the safety master device 10, the safety slave device 20, and the information processing device 50 may be implemented by processing circuits. The processing circuits are, for example, logic ICs (Integrated Circuits), GAs (Gate Arrays), ASICs (Application Specific Integrated Circuits), or FPGAs (Field-Programmable Gate Arrays).

Besides, in the present specification, a superordinate concept of a processor, a memory, a combination of the processor and the memory, and a processing circuit is referred to as a "processing circuitry".

That is, each of the processor, the memory, the combination of the processor and the memory, and the processing circuit is a specific example of the "processing circuitry".

REFERENCE SIGNS LIST

10: safety master device, 20: safety slave device, 30: network, 50: information processing device, 101: processor, 102: memory, 104: field communication interface, 105: bus, 201: processor, 202: memory, 203: input/output interface, 204: field communication interface, 205: bus, 501: processor, 502: memory, 503: communication interface, 504: bus, 1000: safety communication layer, 1001: fieldbus application layer, 10001: safety application interface unit, 10002:

safety connection establishment processing unit, 10003: safety PDU generation unit, 10004: safety PDU inspection unit, 10005: checksum negotiation unit, 10007: safety parameter management unit, 10008: communication cycle verification unit, 2000: safety communication layer, 2001: fieldbus application layer, 20001: safety application interface unit, 20002: safety connection establishment processing unit, 20003: safety PDU generation unit, 20004: safety PDU inspection unit, 20005: checksum negotiation unit, 20007: safety parameter management unit, 20008: communication cycle verification unit, 5001: selection unit, 5002: determination unit, 5003: designation unit.

The invention claimed is:

1. An information processing device comprising:
   processing circuitry:
   to select as a candidate polynomial, a candidate for a generator polynomial to be used in communication between a master device and a slave device from a plurality of polynomials;
   to determine whether or not a calculation using the candidate polynomial is completed in each of the master device and the slave device by a predetermined deadline; and
   to designate the candidate polynomial as the generator polynomial when it is determined that the calculation using the candidate polynomial is completed in each of the master device and the slave device by the deadline.

2. The information processing device according to claim 1,
   wherein the processing circuitry
   selects as the candidate polynomial, a polynomial with a maximum degree from the plurality of polynomials,
   selects as a new candidate polynomial, a polynomial with a smaller degree than the candidate polynomial when it is determined that the calculation using the candidate polynomial is not completed in any of the master device and the slave device by the deadline, and
   determines whether or not a calculation using the new candidate polynomial is completed in each of the master device and the slave device by the deadline.

3. The information processing device according to claim 2,
   wherein the processing circuitry selects as the new candidate polynomial, a polynomial with a smaller degree than the candidate polynomial and with a residual error rate satisfying a required value.

4. The information processing device according to claim 2,
   wherein when it is determined that a calculation using any polynomial is not completed in any of the master device and the slave device by the deadline, the processing circuitry selects as a new candidate polynomial, a polynomial for which an extended deadline which is a longer deadline than the deadline can be used, from the plurality of polynomials, and
   wherein the processing circuitry determines whether or not a calculation using the new candidate polynomial is completed in each of the master device and the slave device by the extended deadline.

5. The information processing device according to claim 2,
   wherein when it is determined that a calculation using any polynomial is not completed in each of the master device and the slave device by the deadline, the processing circuitry selects as a new candidate polynomial, a polynomial for which an extended deadline which is a longer deadline than the deadline can be used, from the plurality of polynomials, and
   wherein the processing circuitry determines whether or not a calculation using the new candidate polynomial for divided data frames obtained by dividing a predetermined data frame is completed in each of the master device and the slave device by the deadline.

6. The information processing device according to claim 1,
   wherein the processing circuitry determines whether or not the calculation using the candidate polynomial is completed in each of the master device and the slave device within a safety communication cycle of a safety communication performed between the master device and the slave device, and
   processing circuitry designates the candidate polynomial as the generator polynomial when it is determined that the calculation using the candidate polynomial is completed in each of the master device and the slave device within the safety communication cycle.

7. The information processing device according to claim 1,
   wherein a combination of two or more polynomials is included in the plurality of polynomials.

8. The information processing device according to claim 1,
   wherein the information processing device is the master device.

9. The information processing device according to claim 1,
   wherein the information processing device is the master device and the slave device.

10. The information processing device according to claim 1,
    wherein the information processing device is a computer different from the master device and the slave device.

11. An information processing method comprising:
    selecting as a candidate polynomial, a candidate for a generator polynomial to be used in communication between a master device and a slave device from a plurality of polynomials;
    determining whether or not a calculation using the candidate polynomial is completed in each of the master device and the slave device by a predetermined deadline; and
    designating the candidate polynomial as the generator polynomial when it is determined that the calculation using the candidate polynomial is completed in each of the master device and the slave device by the deadline.

12. A non-transitory computer readable medium storing an information processing program which causes a computer to execute:
    a selection process of selecting as a candidate polynomial, a candidate for a generator polynomial to be used in communication between a master device and a slave device from a plurality of polynomials;
    a determination process of determining whether or not a calculation using the candidate polynomial is completed in each of the master device and the slave device by a predetermined deadline; and
    a designation process of designating the candidate polynomial as the generator polynomial when it is determined by the determination process that the calculation using the candidate polynomial is completed in each of the master device and the slave device by the deadline.

* * * * *